United States Patent
Yeduru et al.

(10) Patent No.: US 9,614,045 B2
(45) Date of Patent: Apr. 4, 2017

(54) METHOD OF PROCESSING A SEMICONDUCTOR DEVICE AND CHIP PACKAGE

(71) Applicant: Infineon Technologies AG, Neubiberg (DE)

(72) Inventors: Srinivasa Reddy Yeduru, Villach (AT); Joachim Hirschler, Villach (AT); Harald Wiedenhofer, Bad Abbach (DE); Franz Kleinbichler, Villach (AT)

(73) Assignee: INFINEON TECHNOLOGIES AG, Neubiberg (DE)

(*) Notice: Subject to any disclaimer, the term of this patent is extended or adjusted under 35 U.S.C. 154(b) by 91 days.

(21) Appl. No.: 14/488,334

(22) Filed: Sep. 17, 2014

(65) Prior Publication Data

US 2016/0079087 A1 Mar. 17, 2016

(51) Int. Cl.
*H01L 29/41* (2006.01)
*H01L 21/02* (2006.01)
*H01L 21/3105* (2006.01)

(52) U.S. Cl.
CPC ........ *H01L 29/41* (2013.01); *H01L 21/02063* (2013.01); *H01L 21/31058* (2013.01); *H01L 21/02068* (2013.01)

(58) Field of Classification Search
CPC ......... H01L 21/02244; H01L 21/32136; H01L 21/76826; H01L 29/41; H01L 21/02063; H01L 21/31058; H01L 21/026068
See application file for complete search history.

(56) References Cited

U.S. PATENT DOCUMENTS

| 6,042,929 | A | * | 3/2000 | Burke ................... C23C 14/022 |
| | | | | 428/141 |
| 6,734,102 | B2 | | 5/2004 | Rathi et al. |
| 8,603,910 | B2 | | 12/2013 | Koitz et al. |
| 8,786,089 | B2 | | 7/2014 | Watanabe et al. |
| 8,846,548 | B2 | | 9/2014 | Tu et al. |
| 2010/0200538 | A1 | * | 8/2010 | Petisce ................ A61B 5/0006 |
| | | | | 216/13 |
| 2012/0211879 | A1 | | 8/2012 | Watanabe et al. |

(Continued)

FOREIGN PATENT DOCUMENTS

| JP | 2012174951 A | 9/2012 |
| KR | 20140090531 A | 7/2014 |
| WO | 9317453 | 9/1993 |

OTHER PUBLICATIONS

E.M. Liston, L. Martinu & M.R. Wertheimer (1993) Plasma surface modification of polymers for improved adhesion: a critical review, Journal of Adhesion Science and Technology, 7:10, 1091-1127.

(Continued)

*Primary Examiner* — Cheung Lee
*Assistant Examiner* — Stephen C Smith
(74) *Attorney, Agent, or Firm* — Viering, Jentschura & Partner mbB

(57) ABSTRACT

In various embodiments, a method of processing a semiconductor device may include providing a semiconductor device comprising a contact pad and a polymer layer; and subjecting at least a part of the contact pad and the polymer layer to a plasma comprising ammonia.

15 Claims, 8 Drawing Sheets

(56) References Cited

U.S. PATENT DOCUMENTS

2013/0180945 A1* 7/2013 Koitz .................. H01L 24/05
216/13
2014/0191392 A1 7/2014 Tu et al.
2015/0228586 A1* 8/2015 Usami ............... H01L 23/53238
257/751

OTHER PUBLICATIONS

K.S. Siow et al. (2006) Plasma Methods for the Generation of Chemically Reactive Surfaces for Biomolecule Immobilization and Cell Colonization—A Review, Plasma Processes and Polymers, 3, 392-418.

* cited by examiner

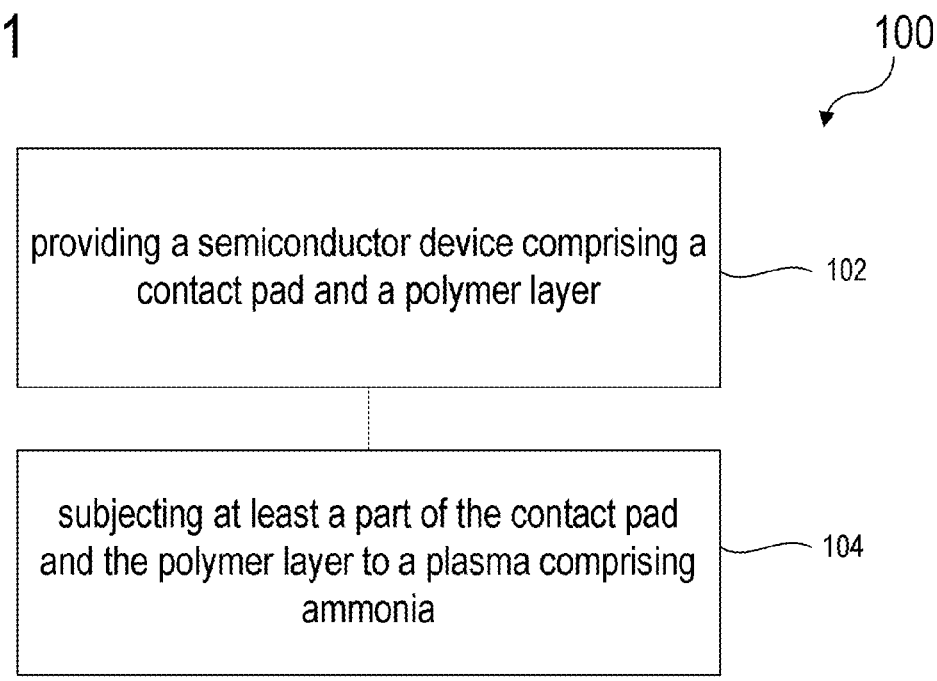

FIG. 5
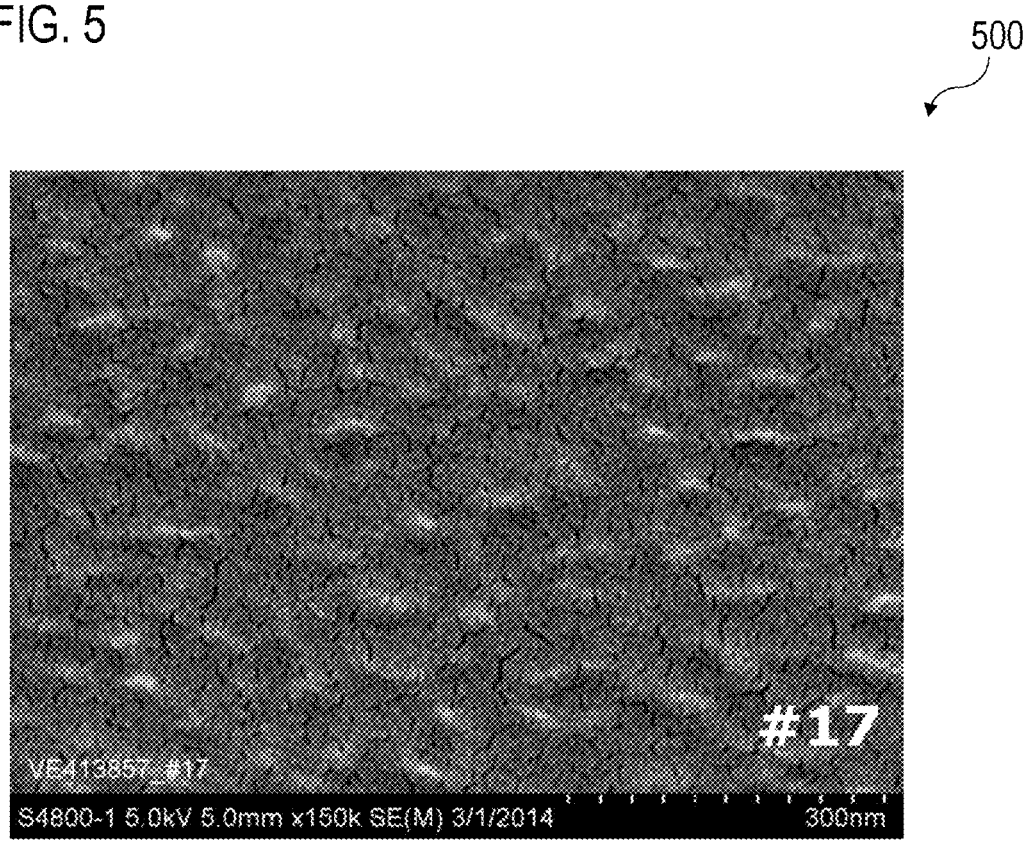
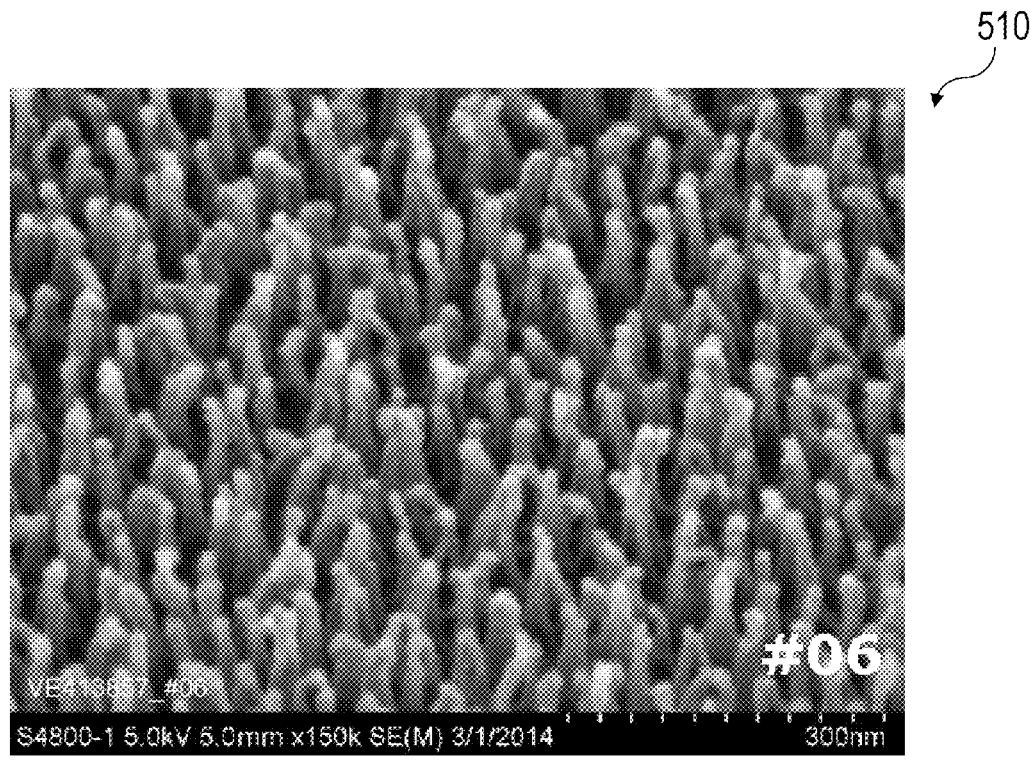

FIG. 5, continued
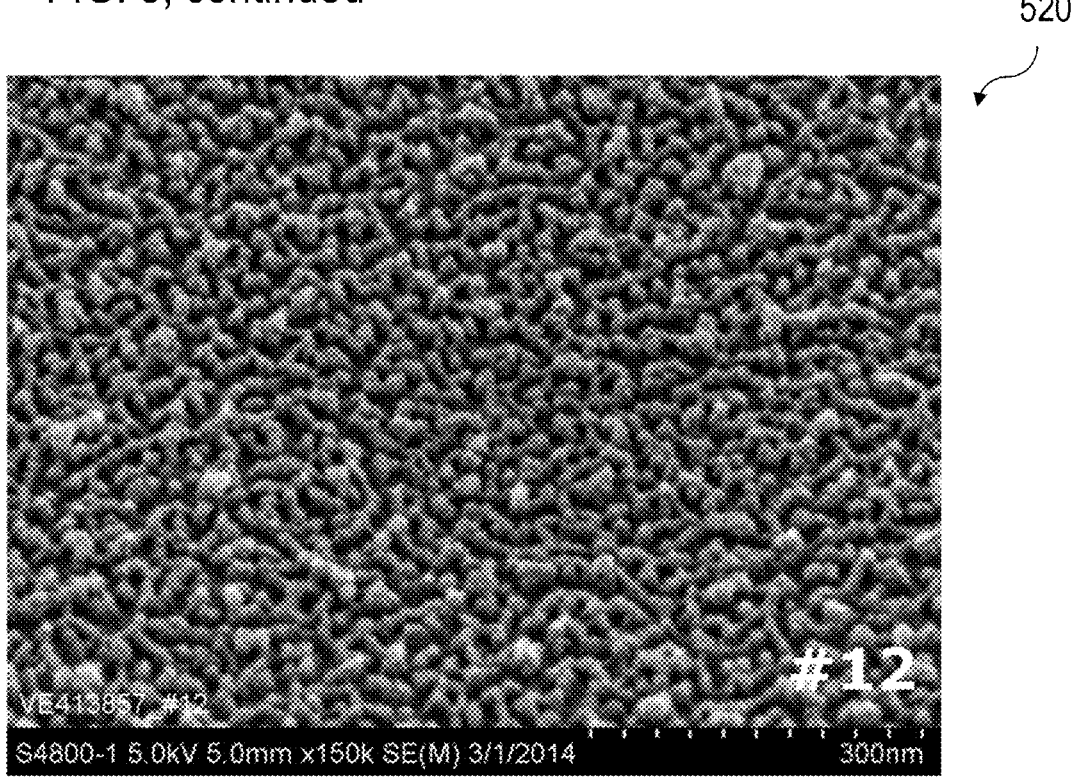

METHOD OF PROCESSING A SEMICONDUCTOR DEVICE AND CHIP PACKAGE

TECHNICAL FIELD

Various embodiments relate generally to a method of processing a semiconductor device and to a chip package.

BACKGROUND

In the fabrication of modern semiconductor devices or integrated circuits (ICs), e.g. chips, one or more contact pads (also referred to as bond pads or, in short, pads) may be provided to electrically contact the device or circuit to/from the outside. On the device, a polymer, for example a polymer layer, e.g. a passivation layer, e.g. a polyimide passivation layer, may be arranged. In this context, effective processing methods for the semiconductor devices, for example methods for processing a surface of the semiconductor device (also referred to as surface processing or surface conditioning processes) may be needed to make the semiconductor device, e.g. its surface, suitable for further processing and use.

SUMMARY

In various embodiments, a method of processing a semiconductor device is provided. The method may include providing a semiconductor device comprising a contact pad and a polymer layer; and subjecting at least a part of the contact pad and the polymer layer to a plasma comprising ammonia.

BRIEF DESCRIPTION OF THE DRAWINGS

In the drawings, like reference signs generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1 shows a diagram illustrating a method of processing a semiconductor device in accordance with an embodiment;

FIG. 5 shows SEM micrographs of a polymer surface before and after applying a method of processing a semiconductor device in accordance with various embodiments;

DESCRIPTION

Figure 2A:
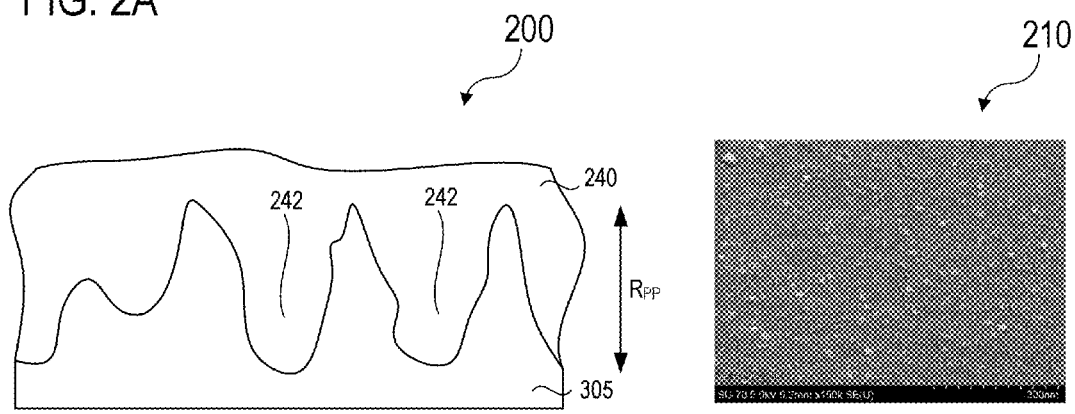
FIG. 2A shows a schematic drawing of a polymer mold-compound interface in accordance with an embodiment on the left, and an SEM micrograph of a polyimide surface on the right.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments. The following detailed description therefore is not to be taken in a limiting sense, and the scope of the present invention is defined by the appended claims.

The term "at least one" as used herein may be understood to include any integer number equal to or greater than one, i.e. "one", "two", "three", . . . , etc.

Unless otherwise indicated, the term "a plurality" as used herein may be understood to include any integer number equal to or greater than two, i.e. "two", "three", "four", . . . , etc.

The terms "coupling" or "connection" as used herein may be understood to include a direct "coupling" or direct "connection" as well as an indirect "coupling" or indirect "connection", respectively.

The terms "contact pad", "bond pad" or "pad" as used herein may be understood to include a designated metallization area at a surface of an integrated circuit (IC) element or device (e.g. at the surface of a die or chip) that may be used to electrically contact the IC element/device from/to the outside. This may, for example, include pads that may be electrically contacted using a bonding process such as, for example, a wire bonding process, a wedge bonding process or a ball bonding process, (other bonding processes such as, for example, clip attach may be possible as well). The terms "contact pad", "bond pad" or "pad" may be used interchangeably herein.

The terms "halogen contamination (of a layer or surface)" or "contamination (of a layer or surface) with a halogen or halogens" as used herein may be understood to refer to the presence of a minor and unwanted amount of a halogen or halogens in the layer or at the surface of a layer. For example, "fluorine contamination (of a layer or surface)" or "contamination (of a layer or surface) with fluorine" may be understood to refer to the presence of a minor and unwanted amount of fluorine in the layer or at the surface of a layer. In other words, besides its regular constituents (i.e. the material or materials of the layer) the layer or surface may include a minor amount of halogen contaminants (e.g. fluorine contaminants). The term "halogen contamination" as used herein may, for example, include the presence of chemical compounds in the layer or at the surface that may be the result of a chemical reaction of the halogen or halogens with the material or materials of the layer or surface. For example, the term "fluorine contamination of a layer or surface containing aluminum" as used herein may include the presence of Al[AlF$_6$] and/or AlF$_3$ in the layer or at the surface. A layer or surface that exhibits halogen contamination may also be referred to herein as a halogen-contaminated layer or surface. For example, a layer or surface that exhibits fluorine contamination may also be referred to herein as a fluorine-contaminated layer or surface.

Figure 2B:
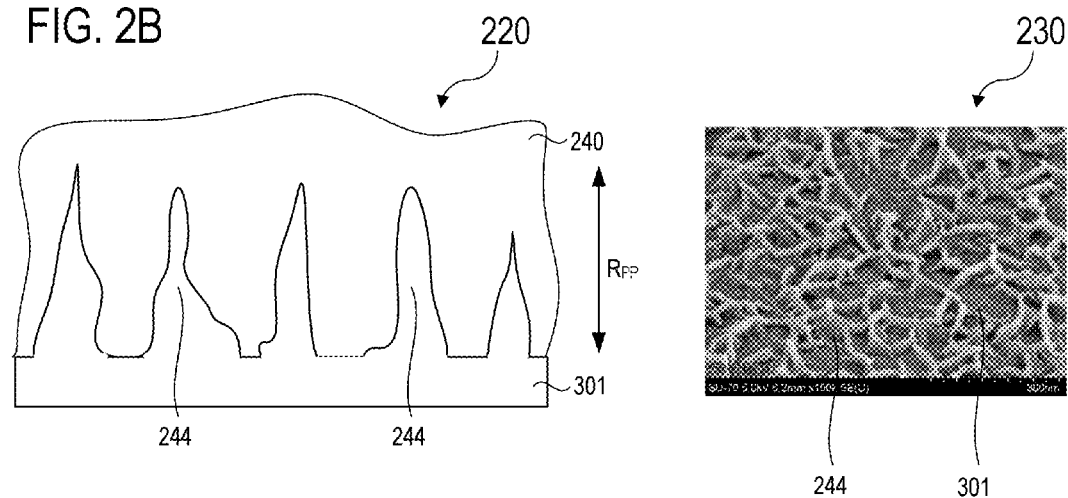
FIG. 2B shows a schematic drawing of a contact pad mold-compound interface in accordance with an embodiment on the left, and an SEM micrograph of a contact pad surface on the right.

The terms "surface roughness", "rough surface profile" or "rough surface" as used herein may refer to small-scale (e.g. nanometer to tens of nanometers range) vertical deviations of a real surface from its ideal large-scale (e.g. micrometer to centimeter range) form. In other words, the terms may be understood to refer to or include a macroscopically rough height profile of a layer, where "height" may clearly refer to the local thickness of that layer. Illustratively, a rough surface may refer to or may include a surface with a rugged interface having a plurality or multiplicity of peaks and valleys, as schematically illustrated in FIG. 2A and FIG. 2B.

In this context, one option to characterize or measure the roughness of a surface (or of its height profile) is the so-called "RMS roughness ($R_{RMS}$)", for which the surface roughness may be measured as a root mean squared of the vertical deviations. In other words, the RMS roughness of a surface with $n=n_x n_y$ surface points (where (x, y) are the lateral coordinates of a surface point, h(x, y) is the surface height at (x, y), $n_x$ is the number of points in direction of the x coordinate and $n_y$ is the number of points in direction of the y coordinate) may be given by $R_{RMS}=(1/n\Sigma(h(x_i,y_j)-h_{av})^2)^{0.5}$, with $h_{av}=1/n\Sigma h(x_i,y_j)$, wherein each sum is taken from i=1 to i=$n_x$ and from j=1 to j=$n_y$, respectively.

As used herein, the terms "surface with high surface roughness", "rough surface", "rough surface profile" and the like may be understood to refer to or include a surface profile (of a layer) that has an RMS roughness ($R_{RMS}$) value that is equal to or greater than a given threshold value, while the terms "surface with a low surface roughness", "smooth surface", "smooth surface profile" and the like may be understood to refer to or include a surface profile (of a layer) that has an RMS roughness ($R_{RMS}$) value that is less than the given threshold value.

The term "plasma" as used herein may be understood to refer to a plasma containing at least one substance in the plasma phase. The plasma may, for example, be located in a process chamber. A plasma containing a plurality of substances in the plasma phase may also be referred to herein as a plasma mixture or as a mixture plasma.

The expression "plasma containing A" as used herein may, for example, be understood to refer to a plasma that contains at least "A" (where "A" may be a substance in the plasma phase) and optionally one or more additional substances in the plasma phase. For example, the expression "plasma containing ammonia" as used herein may be understood to refer to a plasma that contains at least ammonia ($NH_3$) as a plasma, and optionally one or more additional substances in the plasma phase.

In the fabrication of modern semiconductor devices or integrated circuits (ICs), e.g. chips, one or more contact pads (also referred to as bond pads or, in short, pads) may commonly be provided to electrically contact the device or circuit to/from the outside. On the device, a polymer, for example a polymer layer, e.g. a polyimide layer, e.g. a passivation layer, e.g. a polyimide passivation layer, may be arranged.

At present, an adhesion of a package/mold material (which may also be referred to as mold material or, in short, mold) to a surface of the polymer may be so low that a delamination of the package/mold material from the surface of the polymer, e.g. from the polyimide, may occur. In other words, the package/mold material may delaminate from the semiconductor device, e.g. from the chip.

A cause of the delamination may be a weak mechanical interlock between the semiconductor device, e.g. the chip, e.g. the chip surface, e.g. the polymer surface and/or the contact pad surface, e.g. the polyimide surface and/or a metal surface, and the mold, i.e. a mold compound.

A rough surface (visually describing it, a surface with many microscopic peaks, valleys, protrusions and/or openings etc.) may provide an anchorage for the package/mold material to flow into/around. After a hardening of the package/mold material, the package/mold material may be securely mechanically anchored in the rough surface, in other words, the package/mold material may be securely mechanically fixed to the rough surface.

The contact pad of the semiconductor device may be subjected to a so-called adhesion promoter plating, which may form, for example with a high density, dendrite-like structures on the contact pad, e.g. on the metal surface of the contact pad (see, e.g., FIG. 2B (right)). By means of the dendrite-like structures, the package/mold material may be securely fixed to the contact pad, e.g. to the metal surface of the contact pad. This means that the weak mechanical interlock between the polymer surface and the mold/package may primarily be responsible for the delamination, even though, during frontend production, the polymer surface may be treated in a way that may lead to a certain surface roughness (in a range from about 5 nm to about 15 nm).

Regarding the (metallic) surface of the contact pad, today, final pad definition processes (in other words, processes applied to define or form the pads) may frequently use halogen-containing etch chemistry (e.g., fluorine-containing etch chemistry), e.g. when etching a passivation layer, e.g. a silicon nitride layer, over the pad to expose the pad surface (so-called pad opening process). The etching may cause contamination of the exposed contact pad surface, in particular halogen contamination (in other words, contamination of the contact pad surface with halogens or reaction products containing halogens), e.g. fluorine contamination in case of fluorine-containing etch chemistry.

Such halogen (e.g. fluorine) contaminated contact pad surfaces may lead to various non-conformances such as corrosion, optical discolorations, potentially degraded electrical contact resistance properties, and the like.

In order to produce contact pads with low halogen contamination (i.e. with a high quality), pad treatment processes may be applied to reduce the contamination of the pad surface. Examples of pad treatment processes that are currently used to reduce pad surface contamination such as fluorine and organic materials include plasma enhanced processes using Ar (argon), Ar/$O_2$ (argon/oxygen), TMAH (tetra methyl ammonium hydroxide) treatment of the pad surface or a so-called pad-treatment-cure (PTC), which may induce a chemical reaction (Al(AlF$_6$)+6H$_2$O→2Al$_2$O$_3$+12HF) removing the halogen by means of heating. In addition to the PTC, a so-called super soft recess (SSR) may be applied, which may use an $O_2$ plasma pad treatment for surface roughening.

By means of Ar/$O_2$ plasma pad treatment, fluorine contamination of a pad may, for example, be reduced by about 50%. Here, a (contaminated) top surface layer may be removed by means of sputtering with energetic Ar ions. A hydrogen plasma could be applied, which may lead to a chemical reaction 3H$_2$+2AlF$_2$ 2 Al+6HF, which may in principle reduce a fluorine contamination. However, this chemical reaction may not be highly reactive, such that it may not be possible to obtain a significant reduction of the fluorine contamination. By means of an exposure of the contact pad to an oxygen plasma, oxygen radicals may be used to remove a polymer contamination on the contact pad, but this treatment may not be suitable for reducing a fluorine contamination. By means of subjecting the contact pad to a TMAH process, a fluorine contamination of a pad may typically be reduced by about 30%. Applying the PTC may even reduce the fluorine contamination at the surface of the pad to about 15% of its original value. However, the TMAH process may strongly depend on the surface condition after the pad opening plasma process and therefore cases may exist where the TMAH process may not be applicable. Furthermore, in case of aluminum pads, the TMAH process may inhibit growth of a nanometer-thin $Al_2O_3$ (aluminum oxide) pad surface passivation layer. The PTC process may not be suitable for a roughening of the polymer surface and may require the additional plasma treatment, for example the SSR oxygen plasma treatment, of the surface to increase the surface roughness of the polymer.

Each of the front-end methods of processing a semiconductor device, e.g. of processing a surface of a semiconductor device, described above may be selected for one specific purpose, because each of them may have a unique compatibility with different front-end requirements. For example, the PTC may be recommended if a fluorine content of the surface is to be lowered, whereas $ArO_2$ may be suitable for creating a rough polymer, e.g. polyimide, surface layer for creating a good interface to a package/mold material for forming a polymer-mold-compound. However, there may not exist a common method for processing a semiconductor device that may be suitable for obtaining both, a low halogen content in the metal contact pad and a rough polymer surface.

For example for the above-given reasons, it may be desirable to provide one processing method for a semiconductor device that may fulfill all the above-mentioned requirements, for example reduce the halogen contamination of the contact pad and, for example during the same process, create a rough surface of the polymer layer (while leaving a rest of the polymer layer undamaged). The rough surface may for example be similar in structure to the dendrites formed on the surface of the contact pad, or at least similarly suited for providing a strong anchor structure (a robust interface) to the package/mold material.

The processing method for the semiconductor device may further be desired to have a wide application range. In other words, it may be desired to provide one processing method for a semiconductor device with a suitability for being used for different surfaces, for example for different metals, e.g. copper and/or aluminum, and/or different polymers.

In various embodiments, the semiconductor device may include at least a contact pad and a polymer layer. At least a part of the contact pad and at least a part of the polymer layer may be subjected (in other words, exposed) to a plasma including ammonia ($NH_3$). The $NH_3$ plasma, which may also be an $NH_3$ mixture plasma, may create a surface topology, in other words, a surface structure or a surface with sufficiently large surface roughness, that may allow for a robust mechanical interlock. Furthermore, the $NH_3$ plasma may reduce the halogen, e.g. the fluorine, concentration in a surface of the contact pads, for example by means of at least one plasma induced chemical reaction.

In various embodiments, the $NH_3$ plasma or $NH_3$ plasma mixture may furthermore be configured to remove oxides from the pad surface, for example if the pad surface is copper based.

In various embodiments, the $NH_3$ plasma or $NH_3$ plasma mixture may be configured to create a hydrophobic surface, for example to render the contact pad surface hydrophobic.

In various embodiments, the $NH_3$ plasma or $NH_3$ plasma mixture may roughen the polymer surface. For example, e.g. in a case of the polymer including or consisting of polyimide, the $NH_3$ plasma or $NH_3$ plasma mixture may cause a formation of a three-dimensional structure on the surface of the polyimide. The three-dimensional structure may include openings, cavities, protrusions, bridges and the like, rendering the three-dimensional structure suitable for promoting a strong interlock with the mold compound. The three-dimensional structure may for example include elongated structures with a small diameter that may be referred to as (polyimide) nano wires. The nano wires may have a length in a range from about 5 nm to about 100 nm.

In various embodiments, the $NH_3$ plasma mixture may be configured to fulfill all requirements in front-end and back-end processing to remove the halogen from the contact pad surface and to create an enhanced, e.g. optimum, roughness of the polymer, e.g. the polyimide, surface.

The following table may summarize some properties of surfaces (including aluminum contact pads and polyimide) treated with the above described known methods and with the $NH_3$ mixture plasma. F-level may refer to the atomic concentration of fluorine, R may refer to the surface roughness (measured, for example with an atomic force microscope, as a root mean squared (RMS) of vertical deviations from an ideal form of the surface), and ALOX may refer to a thickness of a layer of aluminum oxide formed on the contact pad:

| | $ArO_2$ (Plasma) | PTC (Oven) | PTC + SSR (Oven + Plasma) | $NH_3$ Mixture (Plasma) |
|---|---|---|---|---|
| Polyimide | F-level: 0% R: 15 nm | F-level: 0% R: 3 nm | F-level: 0% R: 8 nm | F-level: 0% R: 10-200 nm |
| Contact Pad | F-level: 13% ALOX: 4 nm | F-level: 3% ALOX: 5 nm | F-level: 3% ALOX: 5 nm | F-level: ≤3.1% ALOX: 3 nm |
| Phenomena | Removing top surface layers by sputtering | Temperature induced chemical reaction | Temperature induced chemical reaction + $O_2$ plasma | Plasma based chemical reaction |

In various embodiments, the $NH_3$ plasma mixture may include one or more substances other than $NH_3$, for example oxygen ($O_2$) or hydrogen ($H_2$). The substance to be added to the $NH_3$ plasma mixture may be selected depending on a metal included in the surface of the contact pad (i.e. a type of metallization used for the contact pad, e.g. aluminum-based or copper based) and on a desired polymer, e.g. polyimide, surface roughness, e.g. whether polyimide nanowires are supposed to be formed.

FIG. 1 shows a diagram 100 illustrating a method of processing a semiconductor device in accordance with an embodiment.

In 102, a semiconductor device may be provided. The semiconductor device may include a contact pad and a polymer layer. In various embodiments, the semiconductor device may have a surface, and the surface may include at least a part of the contact pad, e.g. a part of a surface of the contact pad, and at least a part of the polymer layer, e.g. a part of a surface of the polymer layer. In other words, the surface of the semiconductor device may at least include two parts, a contact pad part, which may be formed by an exposed part of the contact pad, and a polymer part, which may be formed by an exposed part of the polymer layer. In yet other words, the semiconductor device, e.g. a chip, may include the contact pad and the polymer layer, and the contact pad and the polymer layer may be arranged in and/or on the semiconductor device in such a way that at least a part of the contact pad and at least a part of the polymer layer may be exposed.

The surface of the contact pad, which may be part of a topmost layer of the contact pad, may contain aluminum, copper, a copper alloy or an aluminum alloy. In accordance with an embodiment, the contact pad, e.g. the topmost layer of the contact pad, may include or may consist of at least one of the following materials: aluminum (Al), copper (Cu), aluminum silicon (AlSi), aluminium copper (AlCu), aluminum silicon copper (AlSiCu). Alternatively or in addition, the topmost layer of the contact pad may include or may consist of other materials containing aluminum and/or copper.

In accordance with an embodiment, the contact pad may include a single layer (herein also referred to as contact pad layer). In this case, the term "topmost layer of the contact pad" may refer to that layer. Alternatively, the contact pad may include a layer stack (herein also referred to as contact pad layer stack) including a plurality of sublayers. In this case, the term "topmost layer of the contact pad" may refer to the topmost sublayer of the layer stack. The topmost layer of the contact pad may also be referred to herein as surface layer of the (contact) pad or (contact) pad surface layer.

In case the contact pad includes a layer stack including a plurality of sublayers, at least one of the sublayers below the topmost sublayer of the layer stack may include or may consist of at least one of the following materials: titanium (Ti), tungsten (W), copper (Cu), molybdenum (Mo), nickel (Ni), a silicide, tantalum (Ta), vanadium (V), silicon (Si). Alternatively or in addition, one or more sublayers below the topmost sublayer of the layer stack may include or may consist of other materials.

In accordance with an embodiment, the contact pad layer or one or more (e.g. all) sublayers of the contact pad layer stack, including the topmost layer of the contact pad, may, for example, be formed using a suitable deposition process such as, for example, a plating process. Alternatively, other suitable deposition processes such as, for example, thermal spray coating (e.g. combustion torch, electric arc, plasma sprays), vapor deposition (e.g. ion plating, ion implantation, sputtering and sputter deposition, laser surface alloying), chemical vapor deposition (CVD), printing techniques, lamination, oxidation, or others, may be used.

Figure 3A:
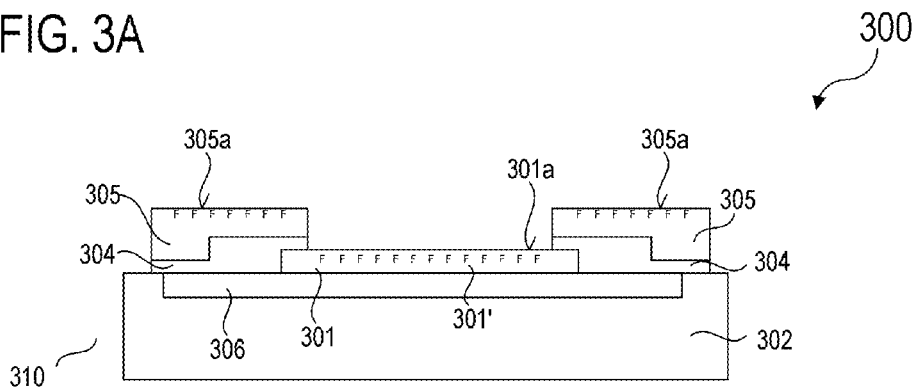
FIGS. 3A to 3C show schematical views illustrating a method of processing a semiconductor device in accordance with various embodiments.

In accordance with various embodiments, the polymer layer may be formed on and/or above a substrate of the semiconductor device (see e.g. FIG. 3A). The polymer layer may be patterned such that at least a part of the contact pad may be exposed.

In accordance with some embodiments, the polymer layer may serve as an adhesion or scratch protection layer, for example to facilitate or increase adhesion to/of a chip packaging material (e.g. to a mold compound, see e.g. FIG. 2A) and/or to protect underlying layers or elements from damages through scratching.

In accordance with an embodiment, the polymer layer may include or may consist of an imide material, for example a photoimide or polyimide material in accordance with some embodiments. In accordance with alternative embodiments, in principle, any material that may be structured or patterned by means of a photolithographical process, or any material that may, for example, resist a plasma etching process, may be used for the polymer layer. For example, other suitable resist materials may be used.

In accordance with various embodiments, the polymer layer may also serve as passivation (e.g. polyimide passivation). Thus, the polymer layer may also be referred to as a passivation layer in accordance with various embodiments.

In accordance with an embodiment, forming the polymer layer on and/or above the substrate may be achieved by means of a suitable deposition process. For example, a spin coating process may be used as deposition process in accordance with an embodiment, however other suitable deposition processes such as, for example, printing, laminating, chemical vapor deposition (CVD), or others, may be used in accordance with other embodiments.

The polymer layer may, for example, be formed to have a layer thickness in the nanometer to micrometer range, for example in the range from several nanometers to several hundred micrometers in accordance with some embodiments, for example in the range from about 1 µm to about 50 µm in accordance with some embodiments, for example in the range from about 3 µm to about 20 µm in accordance with some embodiments, however other values of the thickness may be possible as well in accordance with other embodiments.

In accordance with an embodiment, patterning the polymer layer may, for example, be achieved by depositing a structured polymer layer, e.g. using a mask. Alternatively, the polymer layer may be patterned by means of a lithographical process in combination with an etch process. In other words, the polymer layer may be partially removed, for example in regions that may not be covered by a photolithographical mask. In various embodiments, the polymer layer may be patterned in such a way that at least the part of the contact pad may be exposed.

In accordance with an embodiment, subjecting the contact pad (e.g. the exposed part of the upper surface of the topmost layer of the contact pad) to the plasma including ammonia may be effected in a processing step that directly follows etching the polymer layer. In other words, subjecting the exposed part of the upper surface of the topmost layer of the contact pad to the plasma may be effected directly after a pad opening etch.

In accordance with an embodiment, patterning the polymer layer may, for example, be achieved by means of a lithographical process (including, for example, exposure (e.g. UV exposure) of the polymer layer (e.g. photosensitive polyimide layer) using a photolithographical mask, and development of the exposed layer). Alternatively, other suitable processes may be used to pattern the polymer layer in accordance with other embodiments.

In accordance with an embodiment, the patterned polymer layer (e.g. exposed and developed polyimide layer) may be cured. The term "curing" as used herein may be understood to include the toughening or hardening of the material or materials of a layer, which may be achieved by a specific treatment of that layer. For example, in case of a polymer layer including or consisting of a polymer material such as polyimide, curing (i.e. toughening or hardening) of the polymer layer may refer to the cross-linking of polymer chains that may be brought about, for example, by chemical additives, exposure to UV radiation, heat, electron beam, etc. The curing of the polymer layer may for example avoid a color change of the polymer during further processing of the semiconductor device.

In various embodiments, the polymer layer may not be formed directly on the substrate and/or on the contact pad, but on a further layer, e.g. a further passivation layer, formed on the substrate and/or on the contact pad. In other words, a further layer, e.g. a further passivation layer, may be arranged between the polymer layer and the substrate and/or between the polymer layer and the contact pad. The further passivation layer may for example include or consist of an oxide layer, a nitride layer, e.g. a silicon nitride layer, an oxynitride layer, a carbide layer, or a sandwich passivation including a stack of one or more of the aforementioned layers, etc. The further passivation layer may protect the substrate and/or the contact pad from, e.g., corrosion, humidity, chemicals, etc.

In various embodiments, the further passivation layer may be formed by means of a suitable deposition process such as e.g. a chemical vapor deposition (CVD) process.

In various embodiments, the further passivation layer may be patterned. For example, the further passivation layer may be partially removed, for example by means of etching, for example by means of plasma etching, for example by means of plasma etching.

In accordance with an embodiment, the partial removal of the further passivation layer, for example by means of etching, may make use of a halogen-containing etchant, e.g. a fluorine-containing etchant. In other words, a fluorine based etch chemistry may be used in accordance with an embodiment. In this case, the halogen contamination of the upper surface of the topmost layer of the contact pad may include or may be a fluorine contamination, in other words, a surface contamination with fluorine.

In accordance with an embodiment, the fluorine-containing etchant may include or may be a fluorinated etch gas such as, for example, carbon tetrafluoride ($CF_4$), fluoroform ($CHF_3$), nitrogen trifluoride ($NF_3$), or sulfur hexafluoride ($SF_6$). Alternatively or in addition, other fluorinated etch gases may be used.

In accordance with an embodiment, etching the further passivation layer may be effected using a plasma etch process. In this case, the etchant or etchants used for the etch process may be present in the form of a plasma. As an example, if carbon tetrafluoride ($CF_4$) gas is used as etchant in the plasma etch process, it may be present as $CF_4$ plasma. The etchant or etchants, e.g. etch gases, used in the plasma etch process may also be referred to as plasma etchants.

The further passivation layer may be partially removed in order to expose the part of the contact layer. In various embodiments, the polymer layer may serve as a mask for the patterning of the further passivation layer. The curing of the polymer layer may be performed before the removal, e.g. the etching, of the further passivation layer.

The substrate may, for example, be any suitable substrate used for semiconductor device or integrated circuit (IC) fabrication. For example, in accordance with various embodiments, the substrate may be a semiconductor substrate, for example a substrate based on silicon such as e.g. a silicon bulk substrate or a silicon-on-insulator (SOI) substrate; alternatively, other types of substrates and/or other suitable semiconductor materials, including semiconductor compound materials, may be used. In accordance with some embodiments, the substrate may, for example, be a wafer or may be part of a wafer.

In accordance with some embodiments, the substrate may, for example in an active area, include one or more electronic elements (e.g. transistors, diodes, etc.), e.g. one or more integrated circuits (IC) including one or more circuit elements. In accordance with an embodiment, the substrate may include suitable wiring (e.g. one or more conductive lines or traces, vias, plugs, etc.) that may serve to realize an electrical connection between the electronic element or elements to the at least one contact pad. In accordance with an embodiment, the wiring may, for example, include one or more metallization levels (e.g. metal 1 (M1), metal 2 (M2), metal 3 (M3), . . . , etc.). In accordance with an embodiment, the substrate may, for example, further include suitable electric insulation (e.g. one or more electrically insulating layers, e.g. inter-level dielectric (ILD) or inter-metal dielectric (IMD) layers, etc.) to electrically insulate, for example, different metallization levels from one another, or different conductive lines in the same metallization level.

In accordance with an embodiment, the contact pad, e.g. the contact pad layer or layer stack, may be formed on or above an active area of the substrate (see e.g. FIG. 3A).

In accordance with some embodiments, providing the semiconductor device may include: forming a contact pad, e.g. a contact pad layer or layer stack, on or above a substrate, the contact pad layer or layer stack including at least the topmost layer of the contact pad containing aluminum, copper, an aluminum alloy or a copper alloy; forming a polymer layer, e.g. a passivation layer, e.g. a polyimide layer, on or above the substrate and/or the contact pad, e.g. the contact pad layer or layer stack; etching the polymer layer using at least one halogen-containing etchant, such that at least part of the contact pad, e.g. part of the topmost layer (e.g. part of the upper surface of the topmost layer) of the contact pad is exposed. The etching may cause the halogen contamination of the part of the contact pad, i.e. of the exposed part of the topmost layer (e.g. of the upper surface of the topmost layer) of the contact pad. Describing it differently, a surface may be provided, wherein the surface may include at least a part of a surface of a contact pad and at least a part of a surface of a polymer.

In various embodiments, any other semiconductor device having a contact pad and a polymer layer may be provided, for example a pre-fabricated semiconductor device.

In accordance with some embodiments, at least a part of the contact pad, e.g. the exposed part of the contact pad, may have a halogen contamination. In other words, the exposed part of the topmost layer (e.g. of the upper surface of the topmost layer) of the contact pad may be halogen-contaminated. The halogen contamination may be brought about by the etching of the polymer layer.

In 104, at least a part of the contact pad (e.g. the exposed part of the contact pad, e.g. the exposed part of the surface of the contact pad, e.g. of the upper surface of the topmost layer of the contact pad) and at least a part of the polymer layer, e.g. an exposed part of the polymer layer, e.g. of the surface of the polymer layer, may be subjected (in other words, exposed) to a plasma containing ammonia.

In various embodiments, the at least part of the contact pad and the at least part of the polymer layer may be exposed to the plasma including ammonia for a duration in a range from about 5 seconds to about 1000 seconds, for example from about 40 seconds to about 200 seconds.

In various embodiments, the at least part of the contact pad and of the polymer layer may be subjected to the plasma in a process that may directly follow the exposing the part of the contact pad, for example the etching exposing the contact pad.

In accordance with an embodiment, the plasma may include ammonia. In other words, the plasma may include an ammonia plasma.

In accordance with an embodiment, the plasma may further contain hydrogen (i.e. $H_2$ plasma). In other words, the plasma may be a plasma mixture including at least ammonia plasma and $H_2$ plasma. In other words, the plasma may include a hydrogen plasma in addition to the ammonia plasma.

In accordance with an embodiment, the plasma may contain oxygen (i.e. $O_2$ plasma). In other words, the plasma may be a plasma mixture including at least ammonia plasma and $O_2$ plasma. In other words, the plasma may include an oxygen plasma in addition to the ammonia plasma.

In various embodiments, the at least part of the contact pad and of the polymer layer may first be subjected to a plasma containing ammonia, and thereafter be subjected to a plasma containing oxygen.

In accordance with some embodiments, for example in a case where the contact pad includes aluminum and/or an aluminum alloy, the halogen contamination of the part of the contact pad, e.g. of the exposed part of the topmost layer (e.g. of the upper surface of the topmost layer) of the contact pad, may be reduced, for example its atomic concentration may be lowered, by means of subjecting the part of the contact pad to the plasma. In accordance with some embodiments, a pad surface passivation layer may be formed on the, e.g. exposed, part of the topmost layer (e.g. of the upper surface of the topmost layer) of the contact pad by means of subjecting the contact pad to the plasma.

In other words, in accordance with some embodiments the surface of the contact pad may be treated with a plasma including ammonia, such that halogen surface contaminants (e.g. fluorine contaminants) may be reduced or substantially removed from the pad surface. Furthermore, a pad surface passivation layer may be grown on the pad surface. The pad surface passivation layer may include or may consist of aluminum oxide ($Al_2O_3$). For example, in accordance with various embodiments, the pad surface passivation layer may be an aluminum oxide layer.

In other words, in various embodiments, the surface including at least the part of the surface of the contact pad and the at least part of the surface of the polymer may be subjected to the plasma including ammonia. And in yet other words, in various embodiments, a method of processing a semiconductor device having a contact pad and a polymer layer may include subjecting at least a part of the contact pad and of the polymer layer to a plasma including ammonia.

In various embodiments, in order to obtain a low (e.g. an atomic concentration of around approximately 3.1% or lower) halogen, e.g. fluorine, content of the contact pad, e.g. an aluminum-containing contact pad, and/or of the polymer layer, and/or to remove an oxide layer from the contact pad, e.g. from a copper-containing contact pad, and to obtain a high surface roughness, e.g. higher than about 10 nm, of the surface of the polymer layer, the contact pad and the polymer layer (or at least parts of each, respectively) may be subjected to a plasma including ammonia. Parameters regarding the plasma and/or the way the at least part of the contact pad and the at least part of the polymer layer may be subjected to the plasma may, for example, be adjusted in such a way that desired values for the halogen content and for the surface roughness may be obtained. The parameters that may be varied to this end may for example be plasma constituents (e.g., $NH_3$ plasma without addition of hydrogen or oxygen, $NH_3$ mixture plasma, e.g. a mixture of $NH_3$ with hydrogen, e.g. with a volumetric ratio of ammonia/hydrogen in a range from about 1:1 to about 2:1, or a mixture of $NH_3$ with oxygen, e.g. with a volumetric ratio of ammonia/oxygen in a range from about 2:3 to about 1:1, or a sequential application of ammonia plasma and oxygen plasma); pressure, e.g. a pressure in a processing chamber in a range from about 2 to 5 Pa, operating power, e.g. an operating power of a plasma generator for generating a high-frequency RF electric field, e.g. an RF power in a range from about 700 W to about 1200 W; a bias power of the plasma generator in a range from about 0 W to about 250 W; a processing time in a range from about 30 s to about 300 s, etc.

In various embodiments, for example if the contact pad includes aluminum and/or an aluminum alloy, at least one of the following chemical reactions may take place between the contact pad and the plasma including ammonia:

$NH_3$ Plasma:

$$6AlF_3 + 6NH_3 \rightarrow 3Al + 3N_2 + 18HF$$

In various embodiments, this chemical reaction may lead to a formation of pure aluminum and hydrogen fluoride. The hydrogen fluoride, which may be gaseous, may be removed (or rather, it may remove itself, e.g. by evaporation) from the contact pad. Thereby, the fluorine content of the contact pad, for example of the topmost layer of the contact pad, may be lowered. A similar reaction, with similar result, may take place if the halogen contamination does not include fluorine, but rather, e.g., chlorine.

This reaction may, in various embodiments, be followed by subjecting the part of the contact pad that had been subjected to the ammonia plasma (or at least parts of it) to an oxygen plasma. In other words, the part of the contact pad and of the polymer layer may be subjected to the ammonia plasma and to the oxygen plasma sequentially, i.e. in a sequential process. The following chemical reaction may take place:

$$4Al + 3O_2 \rightarrow 2Al_2O_3$$

$NH_3$ and $O_2$ Mixture Plasma:

$$6AlF_3 + 6NH_3 + 5O_2 \rightarrow 3Al_2O_3 + N_2O + 18HF$$

Here, the part of the contact pad and of the polymer layer may be subjected to the ammonia plasma and to the oxygen plasma simultaneously, i.e. in a simultaneous process. In other words, in various embodiments, the part of the contact pad and of the polymer layer may be exposed to a plasma including a mix of ammonia and oxygen.

In various embodiments, this chemical reaction may lead to a formation of aluminum oxide and hydrogen fluoride. The hydrogen fluoride, which may be gaseous, may be removed (or rather, it may remove itself) from the contact pad. Thereby, the fluorine content of the contact pad, for example of the topmost layer of the contact pad, may be lowered. A similar reaction, with similar result, may take place if the halogen contamination does not include fluorine, but rather, e.g., chlorine.

In various embodiments, a treatment of the contact pad, for example of the contact pad including aluminum, with the oxygen plasma may lead to a formation of an oxide layer, e.g. an $Al_2O_3$ layer, on the surface of the contact pad. The oxide layer may form in both cases, in the sequential process and in the simultaneous process. The oxide layer may serve as a passivation layer for the contact pad.

In accordance with various embodiments, the contact pad surface passivation layer (for example, the aluminum oxide layer) that may be formed by subjecting the contact pad (e.g. the exposed part of the upper surface of the topmost layer of the contact pad) to the oxygen plasma or to the mixture plasma including oxygen may have a layer thickness in the nanometer range, for example a layer thickness of several nanometers, for example a layer thickness equal to or greater than about 2 nm in accordance with some embodiments, for example a layer thickness equal to or greater than about 4 nm in accordance with some embodiments, e.g. about 5 nm in accordance with an embodiment. However, in accordance with other embodiments, other values of the layer thickness may be possible as well.

In principle, a pad surface passivation layer of any desired layer thickness may be obtained. The particular value of the layer thickness and/or the time needed to grow a pad surface passivation layer with such thickness may, for example, be controlled by one or more process parameters such as, for example, operating and/or bias power of the plasma generation device, relative amounts and/or pressure of ammonia and oxygen, reaction time (corresponding, for example, to the time duration of applying the plasma including oxygen), degree of halogen (e.g. fluorine) contamination of the pad surface, etc.

$NH_3$ and $H_2$ Mixture Plasma:

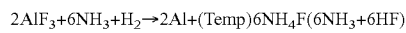

Here, the part of the contact pad and of the polymer layer may be subjected to the ammonia plasma and to the hydrogen plasma simultaneously, i.e. in a simultaneous process. In other words, in various embodiments, the part of the contact pad and of the polymer layer may be exposed to a plasma including a mix of ammonia and hydrogen.

In various embodiments, the chemical reaction may lead to a formation of pure aluminum and of ammonium fluoride, wherein the ammonium fluoride may quickly disintegrate to ammonia and hydrogen fluoride. The hydrogen fluoride, which may be gaseous, may be removed (or it may remove itself) from the contact pad.

In various embodiments, for example in a case where the contact pad includes copper or a copper alloy, an oxide layer that may have formed on the contact pad may be reduced to copper or copper alloy, respectively, by means of a chemical reaction, for example by means of a chemical redox reaction.

In various embodiments, for example if the contact pad includes copper and/or copper alloy, at least a part of the contact pad, for example the part of the contact pad that is exposed, for example a part of the surface of the contact pad, for example a part of the topmost layer of the contact pad, may have oxidized, in other words an oxide layer may have formed thereon. In order to remove the oxide layer, for example for lowering a contact resistance at the contact pad, the oxide layer may be converted (e.g. chemically reduced) to the corresponding metal, e.g. to copper or the copper alloy, respectively. In various embodiments, the chemical reaction may be brought about by means of subjecting the part of the contact pad to the plasma including ammonia. In various embodiments, at least one of the following chemical reactions may take place between the contact pad and the plasma including ammonia:

$NH_3$ Plasma:

$$3CuO+2NH_3 \rightarrow 3Cu+3H_2O+N_2$$

$$3Cu_2O+2NH_3 \rightarrow 6Cu+3H_2O+N_2$$

In various embodiments, both of these chemical reactions may lead to a formation of pure copper, water and nitrogen. The water and the nitrogen may be gaseous (or they may form a plasma) in an environment in which the plasma is formed, e.g. in a process chamber (see below), and they may be removed (or rather, may remove themselves, e.g. by evaporation) from the contact pad. In other words, the copper oxide or the oxide of the copper alloy may, by means of at least one of the chemical reactions above, be converted to copper or a copper alloy, respectively.

$NH_3$ and $H_2$ Mixture Plasma:

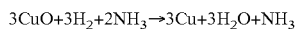

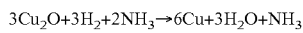

Here, the part of the contact pad and of the polymer layer may be subjected to the ammonia plasma and to the hydrogen plasma simultaneously, i.e. in a simultaneous process. In other words, in various embodiments, the part of the contact pad and of the polymer layer may be exposed to a plasma including a mix of ammonia and hydrogen.

In various embodiments, both of these chemical reactions may lead to a formation of pure copper, water and ammonia. The water and the ammonia may be gaseous (or they may form a plasma) in an environment in which the plasma is formed, e.g. in a process chamber (see below). They may be removed (or rather, may remove themselves) from the contact pad. In other words, the copper oxide or the oxide of the copper alloy may, by means of at least one of the chemical reactions above, be converted to copper or a copper alloy, respectively.

Figure 3B:
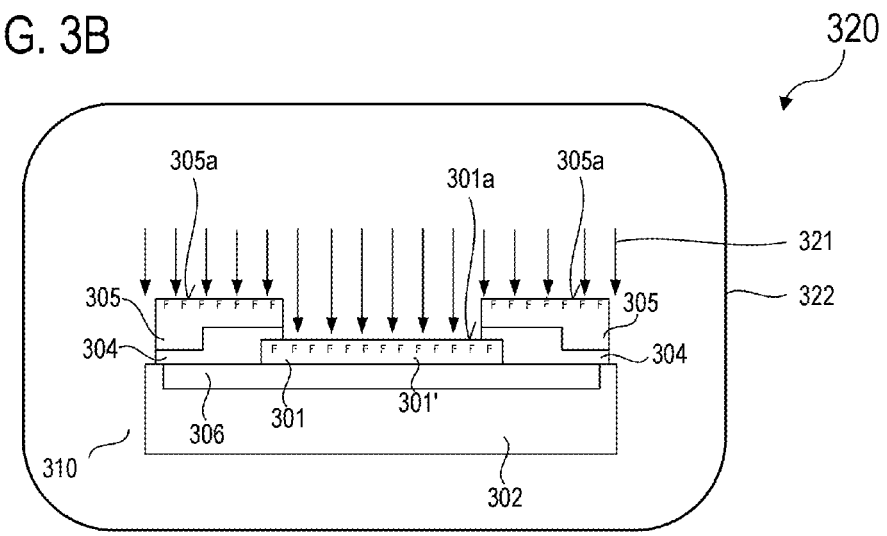

In accordance with some embodiments, subjecting the contact pad (e.g. the exposed part of the upper surface of the topmost layer of the contact pad) to the plasma may be carried out for a time period in the range from about several seconds to about several hours, for example for a time period in the range from about 5 seconds to about 5 hours in accordance with some embodiments, for example for a time period in the range from about 30 seconds to about 30 minutes in accordance with some embodiments In accordance with an embodiment, subjecting the at least part of the contact pad and the polymer layer (e.g. the exposed part of the upper surface of the topmost layer of the contact pad and at least part of the polymer layer) to the plasma may be effected in a process chamber (see e.g. FIG. 3B). To this end, the semiconductor device (e.g. a wafer), on or above which the contact pad and the polymer layer may be formed) may be placed in the process chamber.

The process chamber may, for example, be configured to generate and/or maintain the plasma. For example, the process chamber may include a plasma generating device, and a device restricting the gas to be converted to a plasma in a desired volume, e.g. process chamber walls. In various embodiments, the process chamber may be configured to provide or set and/or control the processing conditions used for the processing of the semiconductor device, such as gas mixtures, pressure conditions, etc. For example, in accordance with some embodiments, the process chamber may include one or more gas inlets to supply the individual components of the plasma (e.g. ammonia and possibly oxygen or hydrogen, and possibly additional gases or gaseous substances).

In accordance with some embodiments, the process chamber may include or may be configured as a reactor, for example as a plasma reactor, for example a reactor for forming a capacitively coupled plasma.

In accordance with other embodiments, other suitable types of process chambers may be used.

In accordance with various embodiments, also the polymer layer, e.g. the polyimide layer, may have a halogen contamination, e.g. a possible fluorine contamination. The halogen contamination may for example be present at the surface of the polyimide layer, or at least in a part of the polyimide layer. In various embodiments, the halogen, e.g. fluorine, contamination in the polymer layer may also be reduced or substantially removed by means of the plasma including ammonia.

In various embodiments, by means of subjecting the at least part of the contact pad and of the polymer layer to the plasma, a surface roughness of the at least part of the surface of the polymer layer may be increased.

Roughening the part of the polymer layer may create small, e.g. microscopic, structures, e.g peaks, valleys, protrusions, bridges and/or openings, in the surface of the polymer layer. The small structures may be configured to provide an anchoring structure in which a package/mold material may anchor. The package/mold material may, in various embodiments, be or include any mold material typically used for packaging semiconductor devices, e.g. an epoxy resin. For the molding process, the mold material may first be liquid, for example the mold material may be heated up to or beyond its melting point. In this state, the mold material may be disposed in a mold frame, where it may be allowed to harden or set. For example, the package/mold material may, in its liquid state, be disposed on the surface of the polymer, where parts of it may flow into valleys and/or openings and/or around peaks and/or protrusions, and then the package/mold material may be allowed to harden. This process may be referred to as mating (of the polymer layer and the package/mold material). Thereby, a robust interface between the polymer and the package/mold material, which may partially be entwined/interleaved/interwoven, may be formed. In other words, after a hardening of the package/mold material, the package/mold material may be securely mechanically anchored in the rough surface, in other words, the package/mold material may be securely mechanically fixed to the rough surface.

In various embodiments, the structure of the rough surface may for example include a plurality of nanowires, wherein each nanowire may include a long axis, and wherein the nanowires may be arranged with their long axes essentially vertical with respect to the surface of the polymer layer. Each nanowire may for example have a length in a range from about 5 nm to about 100 nm.

In various embodiments, the structure of the rough surface may for example be similar to the dendrites formed on the surface of the contact pad.

In various embodiments, the structure of the rough surface may for example be mushroom-like, with protrusions that may be wider at their top than at their bottom.

A surface roughness of the polymer layer, for example of a polyimide layer, before being subjected to the plasma, may for example be up to 3 nm. In various embodiments, after having been subjected to the plasma including ammonia, the surface roughness of the polymer layer, e.g. of the part of the polymer layer, may be in a range from about 10 nm to about 200 nm, for example from about 15 nm to about 100 nm, e.g. from about 20 nm to about 50 nm.

In various embodiments, after the subjecting of the at least part of the contact pad and of the at least part of the polymer layer to a plasma including ammonia, a process flow may continue with further processing steps such as, for example, thinning (e.g. wafer thinning), backside metallization, etc.

FIG. 2A shows a schematic drawing of a polymer mold-compound interface 200 in accordance with an embodiment on the left, and an SEM micrograph 210 of a polyimide surface treated with PTC and SSR (which means that it may be a polyimide surface with a relatively low surface roughness of about 8 nm) on the right.

The polymer mold-compound interface 200 visualizes how the mold 240 may anchor in a rough surface of the polymer 305, e.g. of the polymer layer 305. For example, the mold 240 may have flowed into valleys 242 formed in the surface of the polymer 305, for example when the mold 240 was viscous, for example when it was hot. The mold 240 may have been allowed to harden after having flowed into the microscopic openings formed in the surface of the polymer layer 305. In other words, the mold and the surface of the polymer layer 305 may have been mated.

FIG. 2B shows a schematic drawing of a contact pad mold-compound interface 220 in accordance with an embodiment on the left, and an SEM micrograph 230 of a contact pad surface on the right.

The schematic drawing of the contact pad mold-compound interface 220 shows the contact pad 301, which may, for example on its surface, include aluminum, copper, and/or an alloy of at least one of aluminum and copper. On the surface of the contact pad 301, an adhesion promoter plating may have been applied, which may have formed, for example with a high density, dendrite-like structures 244 on the contact pad 301, e.g. on the metal surface of the contact pad 301. In other words, by means of the adhesion promoter plating, a relatively smooth contact pad surface was converted to a relatively rough contact pad surface. The dendrite-like structures 244 (which may be responsible for the increased roughness of the surface of the contact pad 301) may also be identified on the SEM micrograph 230. As shown in the schematic drawing of the contact pad mold-compound interface 220, the mold may be anchored in the dendrite-like structures and thereby form a strong interconnect with the contact pad 301. It may be desired to form a similarly rough surface on the polyimide shown in the micrograph 210 of FIG. 2A, or, more generally, on at least part of the surface of the polymer layer of the semiconductor device referred to in context with FIG. 1.

Figure 3C:
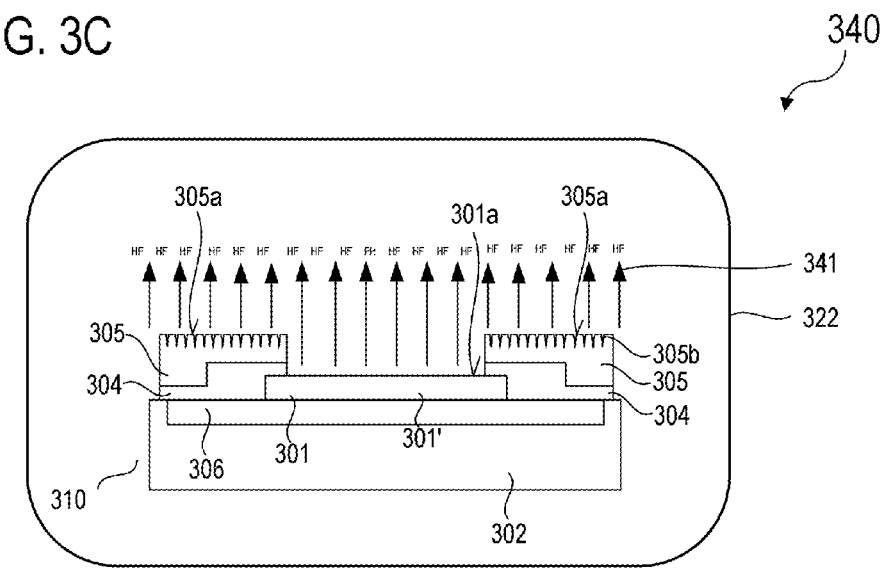

FIGS. 3A to 3C show schematical views illustrating a method of processing a semiconductor device in accordance with various embodiments.

FIG. 3A shows, in a view 300, that a semiconductor device 310 may be provided. The semiconductor device 310 may, in various embodiments, include a contact pad 301 and a polymer layer 305.

The contact pad 301 may, for example, be configured in accordance with one or more embodiments described herein. In accordance with an embodiment, the contact pad 301 may, for example, be disposed on or above a substrate 302, for example on or above an active area 306 of the substrate 302 as shown.

The substrate 302 may, for example, be configured in accordance with one or more embodiments described herein. For example, in accordance with an embodiment the substrate 302 may be a semiconductor substrate such as, for example, a silicon substrate (alternatively other types of substrates may be used). For example, the substrate 302 may be a silicon wafer or part of a silicon wafer in accordance with an embodiment, alternatively, the substrate 302 may be configured differently.

In various embodiments, the active area 306 may for example include one or more electronic elements (e.g. transistors, diodes, etc.), e.g. one or more integrated circuits (IC) including one or more circuit elements.

In addition to the contact pad 301, additional contact pads (not shown) may be disposed on or above the substrate 302 in accordance with some embodiments. The additional contact pads may be configured in a similar or the same manner as described in connection with the contact pad 301 and may be processed in a similar or the same manner as described in connection with the contact pad 301 in accordance with some embodiments.

In accordance with an embodiment, the contact pad 301 may include a single layer 301', as shown. Alternatively, the contact pad 301 may include a layer stack including a plurality of sublayers.

A topmost layer of the contact pad 301 (i.e. the single layer 301' of the contact pad 301 in the embodiment shown; alternatively a topmost sublayer of a plurality of sublayers of a contact pad layer stack) may contain aluminum (Al), copper (Cu), a copper alloy or an aluminum alloy, such as, for example, AlCu, AlSi or AlSiCu (alternatively, other aluminum- and/or copper-containing alloys).

At least part of the contact pad 301, e.g. of an upper surface 301a of the topmost layer 301' of the contact pad 301, may be exposed (in other words, uncovered), as shown. For example, in accordance with some embodiments, parts of the contact pad 301, e.g. sidewalls of the contact pad 301 and peripheral regions of the upper surface 301a of the topmost layer 301' of the contact pad 301, may be covered, for example by a polymer layer 305, which may be a passivation layer, as described above. The polymer layer 305 may be arranged on and/or above the substrate 302. In various embodiments, a further passivation layer 304 may be disposed on or above the substrate 302, for example between the polymer layer 305 and the substrate 302. In accordance with some embodiments, the entire upper surface 301a of the topmost layer 301' of the contact pad 301 may be exposed.

In various embodiments, the polymer layer 305 (and, if present, the further passivation layer 304) may be structured. Structuring may have been accomplished by means of etching, for example by means of plasma etching as described above. The structuring of the polymer layer 305 (and possibly of the further passivation layer 304) may have caused a fluorine contamination, indicated by the "F"s, in the contact pad 301, for example in the exposed part of the upper surface 301a of the topmost layer 301' of the contact pad 301, and in the polymer layer 305, e.g. in an upper surface 305a of the polymer layer 305. In other words, at least part of the upper surface 301a of the topmost layer 301' of the contact pad 301 may be fluorine-contaminated. In still other words, a minor amount of fluorine contaminants may be present at the upper surface 301a of the topmost layer 301' and/or in the topmost layer 301' of the contact pad 301. The fluorine contaminants in the contact pad 301 may, for example, be reaction products of fluorine with aluminum (of the topmost layer 301' of the contact pad 301) such as e.g. $AlF_3$ or $Al[AlF_6]$.

In accordance with some embodiments, the structuring etching may, for example, have been a pad opening etch using a fluorine-containing etchant (e.g. a fluorinated etch gas such as, for example, $CF_4$), in which e.g. the further passivation layer 304 (e.g. an oxide layer, a nitride layer, e.g. a silicon nitride layer, an oxynitride layer, a carbide layer, a sandwich passivation including a stack of one or more of the aforementioned layers, etc.) disposed on or above the contact pad 301 may have been etched to open the pad 301 (i.e. expose the upper surface 301a of the topmost layer 301' of the pad 301), as shown.

FIG. 3B shows, in a view 320, that at least part of the contact pad 301 (for example, the exposed upper surface 301a of the topmost layer 301' of the contact pad 301) and at least part of the polymer layer 305, may be subjected (in other words, exposed) to a plasma 321 containing ammonia. In various embodiments, the at least part of the contact pad 301 and the at least part of the polymer layer 305 may be facing the same direction. In accordance with some embodiments, the plasma 321 may be provided by means of a process chamber 322 (e.g. a plasma reactor), as shown. The process chamber 322 may, for example, be configured to generate and/or maintain the plasma as described herein in connection with various embodiments (for example in connection with FIG. 1). The semiconductor device 310 may be placed in the process chamber 322, as shown. In various embodiments, at least the part of the contact pad 301 and part of the polymer layer 305 may be subjected to the plasma 321 containing ammonia.

The plasma 321 and/or subjecting the at least part of the contact pad 301 and at least part of the polymer layer 305 to the plasma 321 may, for example, be configured or carried out in accordance with one or more embodiments described herein (e.g. in connection with FIG. 1), e.g. with respect to plasma constituents, partial pressures, operating power, bias power, processing time, etc. For example, the plasma 321 may be a plasma mixture 321 further including, for example, hydrogen or oxygen.

FIG. 3C shows, in a view 340, that by means of the plasma 321 the fluorine contamination "F" of the at least part of the contact pad 301, e.g. the exposed part of the upper surface 301a of the topmost layer 301' of the contact pad 301, and of the at least part of the polymer layer may be reduced or substantially removed (indicated by arrows 341).

For example, the ammonia ($NH_3$) of the plasma 321 may react with the fluorine contaminants at or near the upper surface 301a of the topmost layer 301' of the contact pad 301, such that aluminum (Al) and hydrogen fluoride (HF) may be formed.

In various embodiments, for example if the plasma 321 includes ammonia and oxygen, the ammonia ($NH_3$) and the oxygen ($O_2$) of the plasma 321 may react with the fluorine contaminants at or near the upper surface 301a of the topmost layer 301' of the at least part of the contact pad 301, such that aluminum oxide ($Al_2O_3$) and hydrogen fluoride (HF) may be formed. The aluminum oxide ($Al_2O_3$) may cause or contribute to the growth of a thin layer of aluminum oxide (not shown) on the at least part of the contact pad 301, e.g. on the upper surface 301a of the topmost layer 301' of the contact pad 301, while the hydrogen fluoride (HF) may, for example, remove itself from the at least part of the contact pad 301. It may be exhausted from the process chamber 322.

In various embodiments, the at least part of the contact pad 301 and the at least part of the polymer layer 305 may sequentially be subjected to a plasma containing ammonia 341 and to a plasma containing oxygen. In that case, the aluminum oxide ($Al_2O_3$) may form by means of a chemical reaction of the oxygen with the aluminum.

As indicated by the arrows 341 in FIG. 3C, the at least part of the polymer layer 305 (e.g. polyimide layer) may also have its fluorine contamination "F" at the surface 305a of the polymer layer 305 reduced or substantially removed by means of the plasma 321.

In various embodiments, as FIG. 3C shows in a view 340, the evaporation of fluorine (e.g. in the form of hydrogen fluoride (HF)) from the contact pad 301 (indicated by arrows 341) and also from the polymer layer 305 occurs during and/or after subjecting the part of the polymer layer 305 and the part of the contact pad 301 to the plasma containing ammonia. Thus, the fluorine contamination level of both the contact pad 301 and of the polymer layer 305 may be significantly reduced.

Furthermore, the plasma 321 may cause an increase of a surface roughness of the at least part of the polymer layer 305, as indicated by a structuring 305b of the surface 305a. As described above, the structuring 305b of the surface 305a of the polymer layer 305 may for example include openings, bridges, protrusions, dendrite-like structures, mushroom-like structures, nanowires, and the like. The surface roughness of the at least part of the polymer layer 305 may, by means of subjecting it to the plasma, be increased to a range from about 10 nm to about 200 nm, as described above, e.g. in context with FIG. 1. In various embodiments, the increased surface roughness of the at least part of the polymer layer 305 may make a strong interconnect to a mold disposed on the polymer layer 305 possible.

Figure 4:
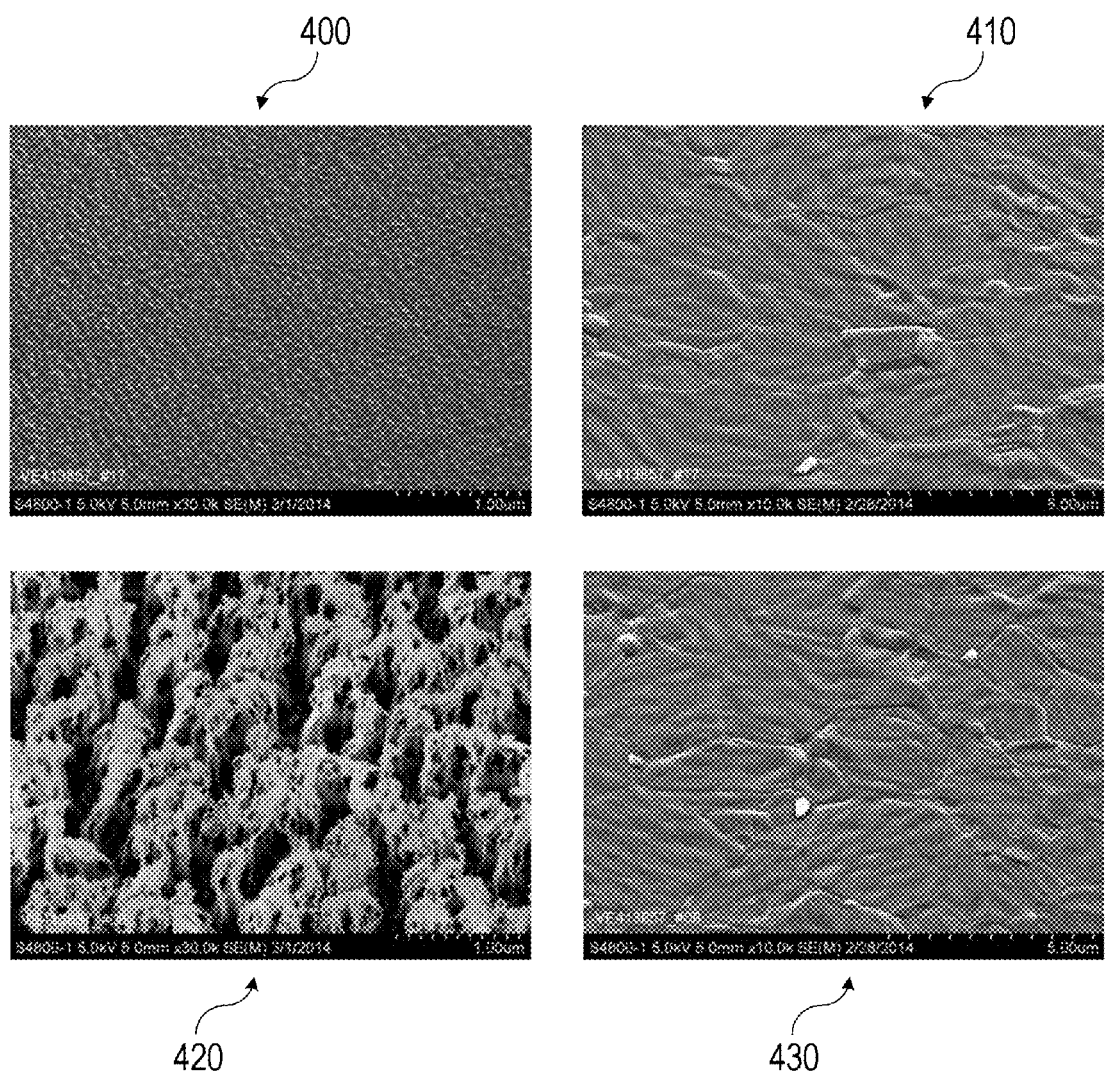
FIG. 4 shows SEM micrographs of a polymer surface (left) before (top) and after (bottom) applying a method of processing a semiconductor device in accordance with an embodiment, and of a contact pad (right) before (top) and after (bottom) applying the method of processing the semiconductor device in accordance with the embodiment.

FIG. 4 shows SEM micrographs of a polymer surface 400, 420 (at a magnification of 30,000) before (in 400) and after (in 420) applying a method of processing a semiconductor device in accordance with an embodiment, for example in accordance with one of the embodiments described above, and of a contact pad 410, 430 (at a magnification of 10,000) before (in 410) and after (in 430) applying the method of processing the semiconductor device in accordance with the embodiment.

The micrographs 400 and 410 show the polymer surface 400 and the contact pad surface 410 before subjecting them to the plasma including ammonia. The polymer surface 400 and the contact pad surface 410 may have been treated with a halogen, e.g. fluorine, containing etch chemistry, e.g. with $CF_4$, e.g. with $CF_4$ plasma.

A fluorine content of the contact pad after the treatment with the fluorine containing etch chemistry and after a PTC treatment of the contact pad may have an atomic concentration around 4.2% at a surface of the contact pad, and around 15% in a depth below the surface of the contact pad, for example in a depth that may be reached by ablating the surface of the contact pad by means of sputtering for about 20 seconds (see also FIG. 6, graph 620). At a sputter rate of about 8 nm/min, this may correspond to a depth of around 2.67 nm.

After having been subjected to plasma, for example sequentially to the plasma including ammonia and to a plasma including oxygen, the contact pad may have an atomic concentration of fluorine of around 3.1% at a surface of the contact pad, and around 10% in a depth below the surface of the contact pad, for example in a depth that may be reached by ablating the surface of the contact pad by means of sputtering for about 20 seconds (see also FIG. 6, graph 630). At a sputter rate of about 8 nm/min, this may correspond to a depth of around 2.67 nm.

In other words, a fluorine content of the contact pad may have been lowered, for example by about 25% or more as compared to the contact pad treated by PTC, for example on the surface of the contact pad and/or in the depth of the contact pad, by means of subjecting the contact pad to the plasma including ammonia. A reduction of the fluorine content as compared with an untreated contact pad may be much higher, e.g. around 70% or even more. A similar reduction in the fluorine content may be obtained if the surface of the contact pad is subjected only to the plasma containing ammonia (see FIG. 6), to a mixture plasma containing ammonia and hydrogen, or to a mixture plasma containing ammonia and oxygen.

In various embodiments, a fluorine content of the polymer layer (in at least a part of the polymer layer), may be reduced by means of subjecting the polymer layer, e.g. at least the part of the polymer layer, to the plasma including ammonia. By means of example, a fluorine content at the surface of the polymer layer and/or in a depth of the polymer layer, e.g. up to several nanometers below the surface of the polymer layer, may be reduced. In various embodiments, the fluorine in the polymer layer may be essentially removed.

In various embodiments, the surface of the polymer layer after PTC treatment (shown in the micrograph 400) may have a relatively smooth surface, with a surface roughness of about 3 nm. In comparison to this, the surface of the polymer layer (shown in the micrograph 420) after having been sequentially subjected to the plasma containing ammonia and to the plasma containing oxygen, may have a relatively rough surface, e.g an RMS surface roughness higher than 10 nm. In various embodiments, as for example shown in the micrograph 420, but also in micrographs 510 and 520 of FIG. 5, a surface structure of the polymer layer may be changed by means of subjecting the at least part of the polymer layer to the plasma containing ammonia. However, below the changed surface, the polymer layer may be unchanged or at least undamaged. In other words, below the modified surface, physical and/or chemical properties of the polymer, e.g. polyimide, layer may remain or be such that the polymer layer may still fulfill its intended function, e.g. passivation, adhesion to a surface below the polymer layer, electrical insulation, etc.

In various embodiments, as for example shown in the micrograph 420, the surface structure of the polymer, e.g. polyimide, surface may be mushroom-like, in other words, the surface may have protrusions that may be narrower closer to the surface. In an exemplary creation of the polymer surface shown in the micrograph 420, a polyimide surface (together with the contact pad surface) may have been exposed sequentially to a plasma containing ammonia and to a plasma containing oxygen. The polyimide surface may have been exposed to the plasma containing ammonia in three steps of a duration of 40 seconds each (i.e. a total of 120 seconds). Following this, the polyimide surface may have been exposed to the oxygen plasma, again in three steps of a duration of 40 seconds each (i.e. a total of 120 seconds).

The mushroom-like structures may form cavities inbetween themselves and/or underneath their tops. A mold, e.g. a liquid mold to be disposed on the polymer layer may flow into the cavities. After hardening there, a stable interconnect between the polymer layer and the mold may have been formed.

The surface roughness generated by means of the subjecting of the at least part of the polymer surface to the plasma containing ammonia may not need to be mushroom-like in shape. Other examples of surface structures are shown in FIG. 5 in the micrographs 510 and 520.

The micrograph 410 may show a relatively smooth surface of the contact pad, at least compared to the surface of the contact pad shown in the micrograph 230 in FIG. 2B. This may indicate that the contact pad in the micrograph 410 may not have undergone adhesion promoter plating. As can be seen from a comparison of the micrographs 410 and 430 (the surface of the contact pad before and after subjecting it to the plasma), a surface roughness of the surface of the (metallic) contact pad may not or essentially not be increased by subjecting it to the plasma including ammonia. As described above, the contact pad may benefit from the treatment with the plasma including ammonia by at least one of having its halogen contamination lowered or removed, and having an oxide layer formed, depending on the material (e.g. the metal) of the contact pad (e.g. the topmost layer of the contact pad) and/or on the composition of the plasma, e.g. constituents of a plasma mixture in addition to the ammonia.

FIG. 5 shows SEM micrographs of a polymer surface (at a magnification of 150,000) before (in 500) and after (in 510, 520) applying a method of processing a semiconductor device in accordance with various embodiments, for example in accordance with various of the embodiments described above.

The polymer surface shown in the micrograph 500 may be a polymer surface directly after an exposure to a halogen-containing etch chemistry. The polymer surface may thus not have been treated yet for surface roughness and/or for halogen content.

In various embodiments, as can be seen from the micrographs 510 and 520, subjecting the polymer surface to the plasma including ammonia may result in different surface structures of the polymer surface.

For example, as shown in the micrograph 510, a plurality of pillar-like structures may form. They may also be referred to as nanowires, wherein each nanowire may include a long axis, and wherein the nanowires may be arranged with their long axes essentially vertical with respect to the surface of the polymer layer. Each nanowire may have a length in a range from about 5 nm to about 100 nm. Each nanowire may have a width in a range from about 5 nm to about 30 nm. In other words, at this magnification, the surface of the polymer layer may resemble a plush carpet. Between the pillar-like structures/nanowires, openings may be formed into which mold may flow, such that the mold, after hardening, may be firmly anchored in the polymer layer, as described above, e.g. in connection with FIG. 2A.

In various embodiments, the nanowire-structure of the polymer surface may be formed by subjecting the polymer surface to a plasma containing ammonia, without an addition of hydrogen or oxygen, for example a pure ammonia plasma. The polymer surface may for example be subjected to the plasma for around 90 s.

In an example shown in the micrograph 520, a plurality of worm-like structures may form. The worm-like structures may be arranged with their long axes essentially parallel to the surface of the polymer layer. The worm-like structures may have a width in a range from about 5 nm to about 20 nm. They may be connected and/or interwoven. In other words, at this magnification, the surface of the polymer layer may resemble a loop-pile carpet. Between the worm-like structures, openings may be formed into which mold may flow, such that the mold, after hardening, may be firmly anchored in the polymer layer, as described above, e.g. in connection with FIG. 2A.

In various embodiments, the worm-like structure of the polymer surface may be formed by subjecting the polymer surface to a plasma containing ammonia and hydrogen, i.e. to a mixture plasma including ammonia and hydrogen, for example with a volumetric ratio of ammonia/hydrogen of 2:1. The polymer surface may for example be subjected to the plasma, i.e. to the plasma mixture, for around 90 s.

Figure 6:
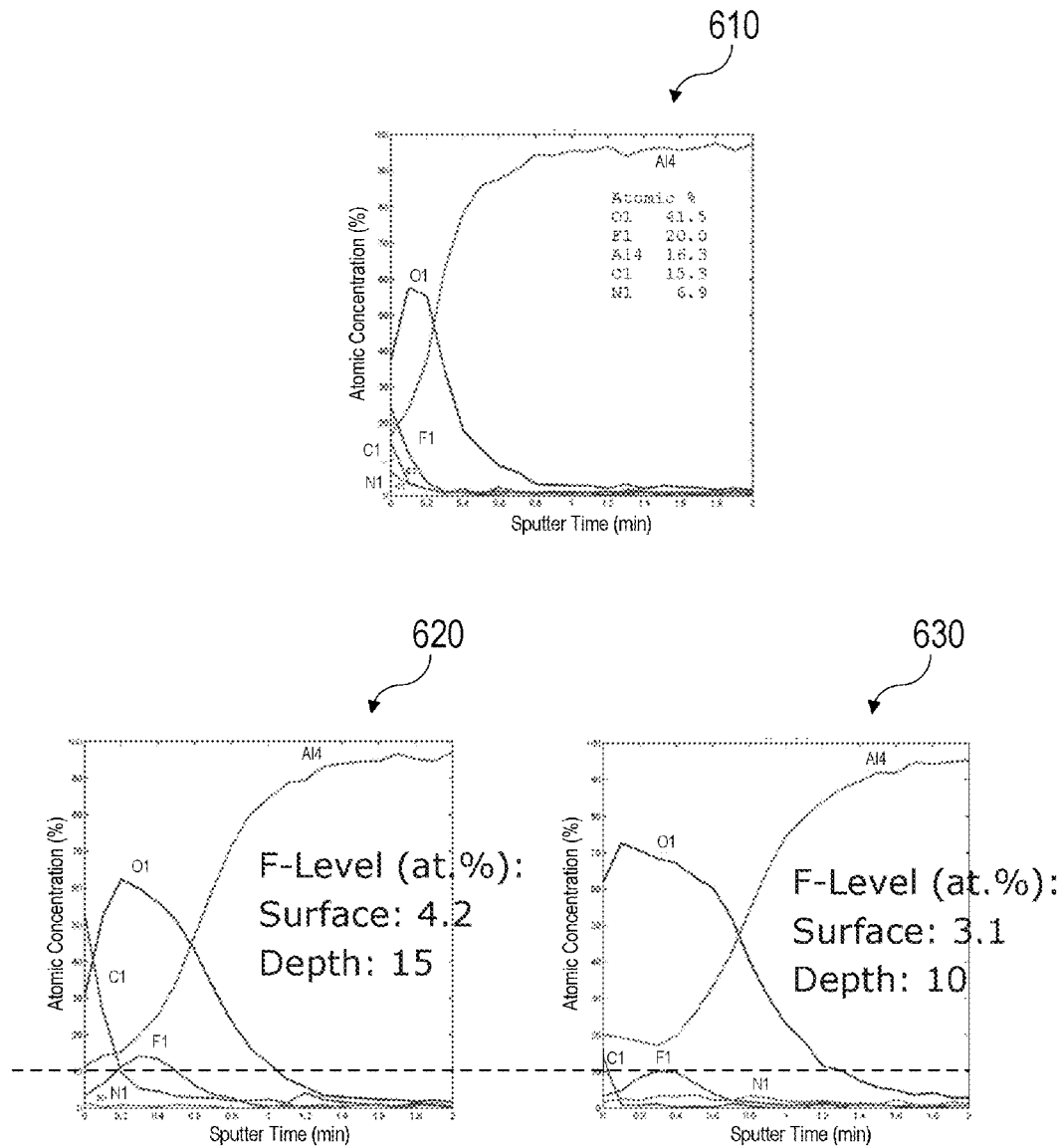
FIG. 6 shows three diagrams, each illustrating a depth distribution of atomic concentrations of various atoms in contact pads for a demonstration of an effect of applying a method of processing a semiconductor device in accordance with various embodiments on a fluorine concentration of the contact pad.

FIG. 6 shows three diagrams, each illustrating a depth distribution of atomic concentrations of various atoms in contact pads for a demonstration of an effect of applying a method of processing a semiconductor device in accordance with various embodiments on a fluorine concentration of the contact pad.

Atomic concentrations of various atoms in contact pads before and after applying a method of processing a semiconductor device in accordance with various embodiments, for example in accordance with various of the embodiments described above, may have been measured by means of progressively ablating thin layers of the surfaces of the respective contact pads and analyzing the atomic concentrations of the various atoms, amongst others for example a fluorine atomic concentration, designated by F1.

The results may be shown in diagrams 610 to 630. The diagrams 610 and 620 may show the contact pad after an etching process using a halogen, e.g. fluorine, containing etchant, and before the plasma treatment. The contact pad in 620 may have been PTC-treated, and the contact pad in 610, which may also be referred to as the untreated pad, may not have undergone treatment after the etching process. In diagram 630, results for the contact pad after the plasma treatment (the contact pad may have been sequentially subjected to ammonia plasma and oxygen plasma, as described above, e.g. in context with micrograph 420 of FIG. 4) are shown.

The y-axis of both diagrams may designate the atomic concentration of the various atoms in percent, and the x-axis of both diagrams may indicate a depth below the surface of the contact pad in units of sputter time, wherein in one minute of sputter time, a depth of 8 nm may be reached. In other words, in both diagrams, the x-axis may span a depth of 16 nm.

As may be seen from the diagrams, the fluorine concentration may be lower in the plasma-treated contact pad. For example, a fluorine concentration at the surface (i.e. at a sputter time of 0 minutes) may be 20% or more (in the untreated pad) and 4.2% (in the PTC-treated pad) before the plasma treatment, and 3.1% after the sequential plasma treatment with ammonia and oxygen. A maximum level of fluorine concentration may, in the untreated pad, be reached at the surface, and in the contact pads treated by PTC or ammonia and oxygen plasma, respectively, be reached in a depth corresponding to about 20 seconds of sputter time, which may correspond to a depth of about 2.66 nm. The maximum level before the plasma treatment may have reached about 20% or more in the untreated pad (on its surface) and 15% in the PTC-treated pad (at a depth of about 2.66 nm), whereas the maximum level after the plasma treatment may have been lowered to about 10% (also at a depth of about 2.66 nm).

In other words, in various embodiments, using the plasma treatment of the metal, e.g. aluminum, pad, the fluorine concentration on the surface of the pad may have been lowered from about 20% or more to about 3.1%, i.e. the fluorine concentration on the surface of the pad may have been reduced by about 85% by the treatment with the mixture plasma of ammonia and hydrogen. A reduction of the same order of magnitude of the fluorine concentration on the surface of the pad may be obtained in a case where only a pure ammonia plasma is used, for example a reduction of 70% or more, e.g. of 80% or more. But even compared to the PTC treatment of the pad, a reduction of the fluorine concentration, e.g. of the fluorine concentration on the surface, may be reached (4.2% on the surface of the PTC-treated pad as compared to 3.1% in the plasma-treated pad).

Figure 7:
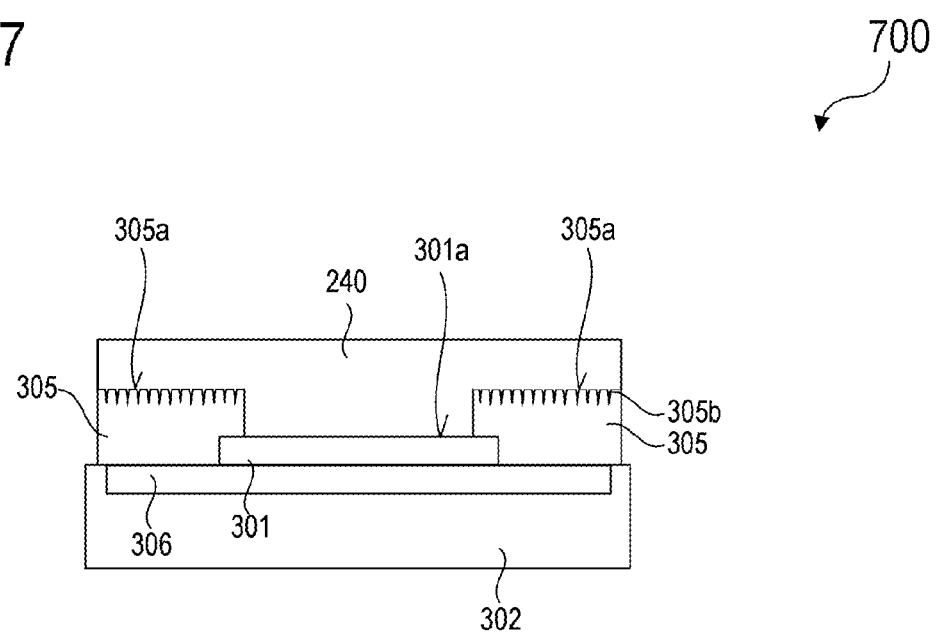
FIG. 7 shows a chip package in accordance with various embodiments.

FIG. 7 shows a chip package 700 in accordance with various embodiments.

The chip package 700 may have been formed in accordance with various embodiments described above. A description of parts, processes, parameters etc. that may be similar or identical to those given above may therefore be omitted.

In various embodiments, a substrate 302 may be a chip 302. In other words, the chip package 700 may include the chip 302, wherein the chip 302 may include an active region 306. The chip package 700 may further include a contact pad 301 arranged over the chip 302 and a polymer layer 305 arranged over the chip 302. In various embodiments, a surface 305a of the polymer layer 305 may have a surface roughness 305b of between 10 nm and 200 nm. The chip package 700 may further include a chip packaging material 240 (also referred to as package material, for example a mold or mold material, e.g. epoxy resin or the like) disposed over the surface 305b of the polymer layer; 305. An atomic concentration of a halogen in a surface layer 301a of the contact pad may be equal to or below 5%.

In the following, exemplary features and potential effects of exemplary embodiments described herein are discussed.

Various embodiments may provide effective treatment processes for semiconductor devices having a contact pad and a polymer layer, to provide defined contact pad and polymer layer surfaces that may, for example, be insensitive to corrosion by environmental conditions and suitable for further processing such as e.g. packaging with a mold material, wafer thinning, backside metallization, wire bonding, wedge bonding, or other processing steps or stages.

Various embodiments may provide treatment processes for semiconductor devices that may avoid discolored, especially halogen (in particular, fluorine) contaminated contact pad surfaces. Thus, various non-conformances such as optical discolorations, non-stick on pad deviations, weak bond shear test results or potentially degraded electrical contact resistance properties, may be avoided.

Furthermore, contact pad metallizations with defined aluminum oxide thickness and less halogen contamination (e.g. less fluorine contamination) may be obtained in accordance with various embodiments.

In accordance with various embodiments, polymer layer (e.g. polyimide layer) surfaces with a high surface roughness and less halogen contamination (e.g. less fluorine contamination) may be obtained that may, for example, provide good adhesion to chip packaging material (e.g. mold compound).

Various embodiments may provide a treatment process for a semiconductor device having a contact pad and a polymer layer that may evaporate or distribute a halogen contamination (e.g. fluorine contamination) of the pad surface and may, at the same time, provide a homogeneous aluminum oxide ($Al_2O_3$) layer on the pad metallization, which may serve as a passivation of the pad surface. The contamination (e.g. fluorine contamination) of the pad surface and of the polymer layer (e.g. polyimide layer)) may have been caused by an overetching step during a pad opening etch (using, for example, a fluorinated etch gas, e.g. a $CF_4$ plasma or the like). It has to be noted that different etching processes may leave different (e.g. fluorine) contamination levels on the pad metallization surface.

A method of processing a semiconductor device in accordance with various embodiments may include: providing a semiconductor device having a contact pad and a polymer layer; and subjecting at least a part of the contact pad and the polymer layer to a plasma including ammonia.

In various embodiments, by means of subjecting the part of the polymer layer to the plasma, a surface roughness of the polymer may be increased.

In various embodiments, at least one of the contact pad and the polymer layer may include a halogen contamination, and the halogen contamination of the at least one of the contact pad and the polymer layer may be reduced by means of subjecting the at least one of the contact pad and the polymer layer to the plasma.

In various embodiments, the halogen contamination may include a fluorine contamination.

In various embodiments, the polymer layer may include polyimide.

In various embodiments, the contact pad may include at least one of copper, aluminum, a copper alloy and an aluminum alloy.

In various embodiments, the plasma further includes oxygen.

In various embodiments, the plasma further includes hydrogen.

In various embodiments, the contact pad includes at least one of aluminum and an aluminum alloy, and the plasma includes a mixture of ammonia and one of hydrogen and oxygen.

In various embodiments, the contact pad includes at least one of copper and a copper alloy, and the plasma includes a mixture of ammonia and hydrogen.

In various embodiments, the method may further include subjecting at least the part of the contact pad and the polymer layer to a second plasma including oxygen.

In various embodiments, subjecting the contact pad to the plasma may be carried out for a time period in the range from about 5 seconds to about 1000 seconds.

In various embodiments, providing the semiconductor device may include forming the contact pad on or above a substrate of the semiconductor device; forming a polymer over at least the contact pad; and exposing the at least part of the contact pad by means of partially removing the polymer; wherein, for the exposing of the part of the contact pad, at least one halogen-containing etchant may be used, wherein the etching may cause the halogen contamination of the at least one of the contact pad and the polymer layer.

A method of processing a semiconductor device in accordance with various embodiments may include: providing a semiconductor device having a contact pad including at least one of aluminum, copper, an aluminum alloy and a copper alloy, and a polymer layer including polyimide; subjecting at least a part of the contact pad and the polymer layer to a plasma including ammonia.

In various embodiments, the plasma may further include oxygen or hydrogen.

A chip package in accordance with various embodiments may include: a chip; a contact pad arranged over the chip; a polymer layer arranged over the chip, wherein a surface of the polymer layer may have a surface roughness of between 10 nm and 200 nm; and a chip packaging material disposed over the surface of the polymer layer; wherein an atomic concentration of a halogen in a surface layer of the contact pad may be equal to or below 5%.

Various aspects of the disclosure are provided for devices, and various aspects of the disclosure are provided for methods. It will be understood that basic properties of the devices also hold for the methods and vice versa. Therefore, for sake of brevity, duplicate description of such properties may have been omitted.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method of processing a semiconductor device, the method comprising:
   providing a semiconductor device comprising a contact pad and a polymer layer; and
   increasing a surface roughness of the polymer layer by subjecting at least a part of the contact pad and of the polymer layer to a plasma comprising ammonia.

2. The method of claim 1, wherein at least one of the contact pad and the polymer layer comprises a halogen contamination, and wherein the halogen contamination of the at least one of the contact pad and the polymer layer is reduced by means of subjecting the at least one of the contact pad and the polymer layer to the plasma.

3. The method of claim 2, wherein the halogen contamination comprises a fluorine contamination.

4. The method of claim 1, wherein the polymer layer comprises polyimide.

5. The method of claim 1, wherein the contact pad comprises at least one of copper, aluminum, a copper alloy and an aluminum alloy.

6. The method of claim 1, wherein the plasma further comprises oxygen.

7. The method of claim 1, wherein the plasma further comprises hydrogen.

8. The method of claim 1, wherein the contact pad comprises at least one of aluminum and an aluminum alloy, and the plasma comprises a mixture of ammonia and one of hydrogen and oxygen.

9. The method of claim 1, wherein the contact pad comprises at least one of copper and a copper alloy, and the plasma comprises a mixture of ammonia and hydrogen.

10. The method of claim 1, further comprising:
subjecting at least the part of the contact pad and the polymer layer to a second plasma comprising oxygen.

11. The method of claim 1, wherein subjecting the contact pad to the plasma is carried out for a time period in the range from about 5 seconds to about 1000 seconds.

12. The method of claim 2, wherein providing the semiconductor device comprises:

forming the contact pad on or above a substrate of the semiconductor device;

forming a polymer over at least the contact pad; and exposing the at least part of the contact pad by means of partially removing the polymer;

wherein, for the exposing of the part of the contact pad, at least one halogen-containing etchant is used, wherein the etching causes the halogen contamination of the at least one of the contact pad and the polymer layer.

13. A method of processing a semiconductor device, the method comprising:

providing a semiconductor device comprising a contact pad comprising at least one of aluminum, copper, an aluminum alloy and a copper alloy, and a polymer layer comprising polyimide;

increasing a surface roughness of the polymer layer by subjecting at least a part of the contact pad and the polymer layer to a plasma comprising ammonia.

14. The method of claim 13, wherein the plasma further comprises oxygen or hydrogen.

15. A chip package, comprising:

a chip;

a contact pad arranged over the chip;

a polymer layer arranged over the chip, wherein a surface of the polymer layer treated with a plasma comprising ammonia has a surface roughness of between 10 nm and 200 nm; and a chip packaging material disposed over the surface of the polymer layer;

wherein an atomic concentration of a halogen in a surface layer of the contact pad is equal to or below 5%.

* * * * *